US009286993B2

(12) United States Patent
Lasser

(10) Patent No.: US 9,286,993 B2
(45) Date of Patent: Mar. 15, 2016

(54) DETERMINING READ VOLTAGES FOR READING MEMORY

(71) Applicant: SANDISK TECHNOLOGIES INC., Plano, TX (US)

(72) Inventor: Menahem Lasser, Kohav-Yair (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/282,967

(22) Filed: May 20, 2014

(65) Prior Publication Data

US 2014/0269050 A1 Sep. 18, 2014

Related U.S. Application Data

(63) Continuation of application No. 13/800,059, filed on Mar. 13, 2013.

(51) Int. Cl.
G11C 11/34 (2006.01)
G11C 16/34 (2006.01)
G11C 16/26 (2006.01)
G11C 11/56 (2006.01)
(Continued)

(52) U.S. Cl.
CPC ........ *G11C 16/3427* (2013.01); *G11C 11/5642* (2013.01); *G11C 16/0483* (2013.01); *G11C 16/26* (2013.01); *G11C 16/3418* (2013.01); *G11C 16/3422* (2013.01); *G11C 29/021* (2013.01); *G11C 29/028* (2013.01); *G11C 29/42* (2013.01); *G11C 2211/5646* (2013.01)

(58) Field of Classification Search
CPC .............................. G11C 16/3427; G11C 16/26

USPC ............................ 365/185.24, 185.18, 185.22
See application file for complete search history.

(56) References Cited

U.S. PATENT DOCUMENTS 7,518,923 B2 * 4/2009 Mokhlesi ................. 365/185.18
7,545,678 B2 * 6/2009 Lee et al. ................. 365/185.21
(Continued)

FOREIGN PATENT DOCUMENTS

WO 2008111058 A2 9/2008

OTHER PUBLICATIONS

International Search Report and Written Opinion of the International Searching Authority (EPO) for International Application No. PCT/US2014/022755, mailed Jun. 17, 2014, 10 pages.
(Continued)

*Primary Examiner* — Viet Q Nguyen
(74) *Attorney, Agent, or Firm* — Toler Law Group, PC

(57) ABSTRACT

A method of reading data at a data storage device that includes a non-volatile memory having a three-dimensional (3D) configuration includes identifying a first set of storage elements of a first word line of the non-volatile memory that satisfy a condition. The condition is based on one or more states of one or more storage elements. The method includes determining a first read voltage corresponding to the first set of storage elements of the first word line and determining a second read voltage corresponding to a second set of storage elements of the first word line that do not satisfy the condition. The method includes reading data from the first word line by applying the first read voltage to the first set of storage elements of the first word line and applying the second read voltage to the second set of storage elements of the first word line.

30 Claims, 3 Drawing Sheets

(51) Int. Cl.
*G11C 16/04* (2006.01)
*G11C 29/02* (2006.01)
*G11C 29/42* (2006.01)

(56) References Cited

U.S. PATENT DOCUMENTS

| | | | |
|---|---|---|---|
| 7,876,621 B2 | 1/2011 | Sharon et al. | |
| 7,944,754 B2 | 5/2011 | Cernea | |
| 8,000,135 B1* | 8/2011 | Perlmutter et al. | 365/185.03 |
| 8,040,725 B2* | 10/2011 | Kang | 365/185.03 |
| 8,233,324 B2 | 7/2012 | Sharon et al. | |
| 8,345,487 B2* | 1/2013 | Kim et al. | 365/185.2 |
| 8,400,858 B2* | 3/2013 | Meir et al. | 365/207 |
| 8,406,053 B1* | 3/2013 | Dutta | G11C 11/5642 |
| | | | 365/185.03 |
| 8,516,183 B2* | 8/2013 | Eun et al. | 711/103 |
| 8,565,020 B2* | 10/2013 | Futatsuyama et al. | 365/185.03 |
| 8,644,067 B2* | 2/2014 | Jeon | G06F 11/1072 |
| | | | 365/185.03 |
| 8,645,794 B1* | 2/2014 | Meir et al. | 714/763 |
| 8,683,297 B2* | 3/2014 | Jeon et al. | 714/769 |
| 8,693,257 B2* | 4/2014 | Sridharan et al. | 365/185.2 |
| 8,767,468 B2* | 7/2014 | Lee et al. | 365/185.18 |
| 8,773,904 B2* | 7/2014 | Anholt et al. | 365/185.03 |
| 8,773,905 B1* | 7/2014 | Radinski et al. | 365/185.03 |
| 8,780,641 B2* | 7/2014 | Chen et al. | 365/185.24 |
| 8,792,281 B2* | 7/2014 | Baum et al. | 365/185.21 |
| 8,811,094 B2* | 8/2014 | Lee et al. | 365/185.29 |
| 8,830,750 B1* | 9/2014 | Cheng et al. | 365/185.09 |
| 8,838,881 B2* | 9/2014 | Patapoutian | G06F 12/0246 |
| | | | 711/103 |
| 8,902,674 B2* | 12/2014 | Yang et al. | 365/189.05 |
| 8,937,838 B2* | 1/2015 | Tang et al. | 365/185.2 |
| 2009/0199074 A1 | 8/2009 | Sommer | |
| 2009/0282186 A1 | 11/2009 | Mokhlesi et al. | |
| 2010/0020611 A1 | 1/2010 | Park | |
| 2010/0131697 A1 | 5/2010 | Alrod et al. | |
| 2010/0165738 A1 | 7/2010 | Cernea | |
| 2011/0066902 A1 | 3/2011 | Sharon et al. | |
| 2012/0026789 A1 | 2/2012 | Shalvi et al. | |
| 2012/0140560 A1 | 6/2012 | Yang | |
| 2012/0170378 A1 | 7/2012 | Aritome et al. | |
| 2014/0043903 A1* | 2/2014 | Ok et al. | 365/185.03 |
| 2014/0056066 A1 | 2/2014 | Baum et al. | |
| 2014/0258590 A1* | 9/2014 | Kochar et al. | 711/103 |
| 2014/0269085 A1* | 9/2014 | Lasser | 365/185.18 |
| 2014/0293696 A1* | 10/2014 | Lin et al. | 365/185.12 |
| 2015/0006976 A1* | 1/2015 | Jeon et al. | 714/54 |

OTHER PUBLICATIONS

Non-Final Office Action mailed Apr. 23, 2015 in U.S. Appl. No. 13/800,059, 19 pages.
Final Office Action mailed Sep. 22, 2015 in U.S. Appl. No. 13/800,059, 21 pages.
International Preliminary Report on Patentability for International Application No. PCT/US2014/022755, mailed Sep. 24, 2015, 8 pages.

* cited by examiner

DETERMINING READ VOLTAGES FOR READING MEMORY

REFERENCE TO EARLIER-FILED APPLICATIONS

This application is a continuation of and claims priority to U.S. Non-Provisional patent application Ser. No. 13/800,059, filed Mar. 13, 2013, the contents of which are incorporated by reference herein in their entirety.

FIELD OF THE DISCLOSURE

The present disclosure is generally related to determining read voltages for reading a memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) NAND flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

The effect of cross-coupling (also known as "Yupin Effect") is well known in NAND memories. The effect causes an effective upward shift of the threshold voltage of a target cell according to the voltage level programmed in an adjacent cell. Because of the closed-loop algorithm used for programming a target cell (successive program-and-verify steps), the size of the voltage shift occurring in the neighbor cell after the target cell had already been brought to its desired threshold voltage is more relevant for the purpose of determining the cross-coupling effect than the absolute voltage to which the interfering neighbor cell is set. The cross coupling effect for a given target cell is determined by adjacent memory cells that are programmed later than the target cell and is not determined by cells that are programmed earlier than the target cell. Historically, the most influential neighbor cell for a given target cell is the cell located on the same bit line on the target cell and on the next word line. This cell is herein referred to as "upper cell". Additional cells that produce coupling effects are the two cells located diagonally to the target cell on the next word line and the two cells located on the same word line as the target cell immediately to the right and left of the target cell. Other more distant cells may also produce coupling effects, though to a lesser extent. The specific magnitude of the coupling effect produced by each cell depends on the programming plan used when filling a block of cells with data (i.e., the sequence of programming steps to bring all cells to their target states).

In a cell voltage distribution (CVD) of the threshold voltages of the cells sharing a common word line, the cross-coupling effect translates into both shifting and widening of the lobes of the CVD representing the various states the cells are being programmed to. The widening is caused by some of the cells being shifted strongly because of a strong coupling effect (e.g., by their upper neighbor) while other cells are not shifted at all or only slightly shifted (e.g., because their upper neighbor is left in its erased state or is shifted only a small amount).

The shifting and widening of the Cell Voltage Distribution (CVD) lobes introduce errors into the reading of the data stored in a word line. To combat the errors introduced by shifting of the CVD lobes it is common to employ some form of dynamic reading. Dynamic reading can include changing the location of reading points along the voltage axis so that the reading reference points differentiate between adjacent lobes even after the lobes have been shifted. A dynamic reading technique known as "CVD tracking" includes taking a sequence of binary readings along the voltage axis and counting, for each reading point, the number of cells on the word line having a threshold voltage on each side of the reading point. By "differentiating" the resulting data (by calculating the difference between the number of cells that are "ON" in each interval and the number that are "ON" in the previous interval) a histogram may be generated that shows the number of cells in the word line having a threshold voltage within each of the voltage intervals between successive reading points. The histogram can be used to estimate the minimum points separating adjacent lobes and to set the dynamic reading points to those minimum points, thus enhancing separation between the lobes and reducing errors due to the shifting effect. However, bit errors may still occur when reading data from the word line using the estimated minimum points.

Improving selection of read voltages in a data storage device to achieve a greater reduction in bit errors may extend a useful life of the data storage device and/or may enable a comparable useful life to be achieved while operating using a lower-complexity error correction coding (ECC) decoder. Using a lower-complexity ECC decoder enables enhanced performance, reduced cost, and/or reduced power consumption as compared to using a higher-complexity ECC decoder.

SUMMARY

A selective CVD tracking procedure is independently performed for storage elements that are subject to strong cross coupling effects and for storage elements that are not subject to strong cross-coupling effects. As compared to performing a single CVD tracking procedure for a cell population, performing independent CVD tracking based on coupling strength reduces bit errors in storage elements that are subject to strong coupling effects.

DETAILED DESCRIPTION

For clarity of explanation, descriptions provided in this disclosure may be based on an assumption that the only significant contributor to a cross-coupling effect is the upper neighbor cell and the other neighbors can be ignored. However, the techniques and devices described in the present disclosure are also applicable to cases where other neighboring cells are the main source of coupling effects and also to cases where multiple neighboring cells jointly contribute to the coupling effect.

Figure 1:
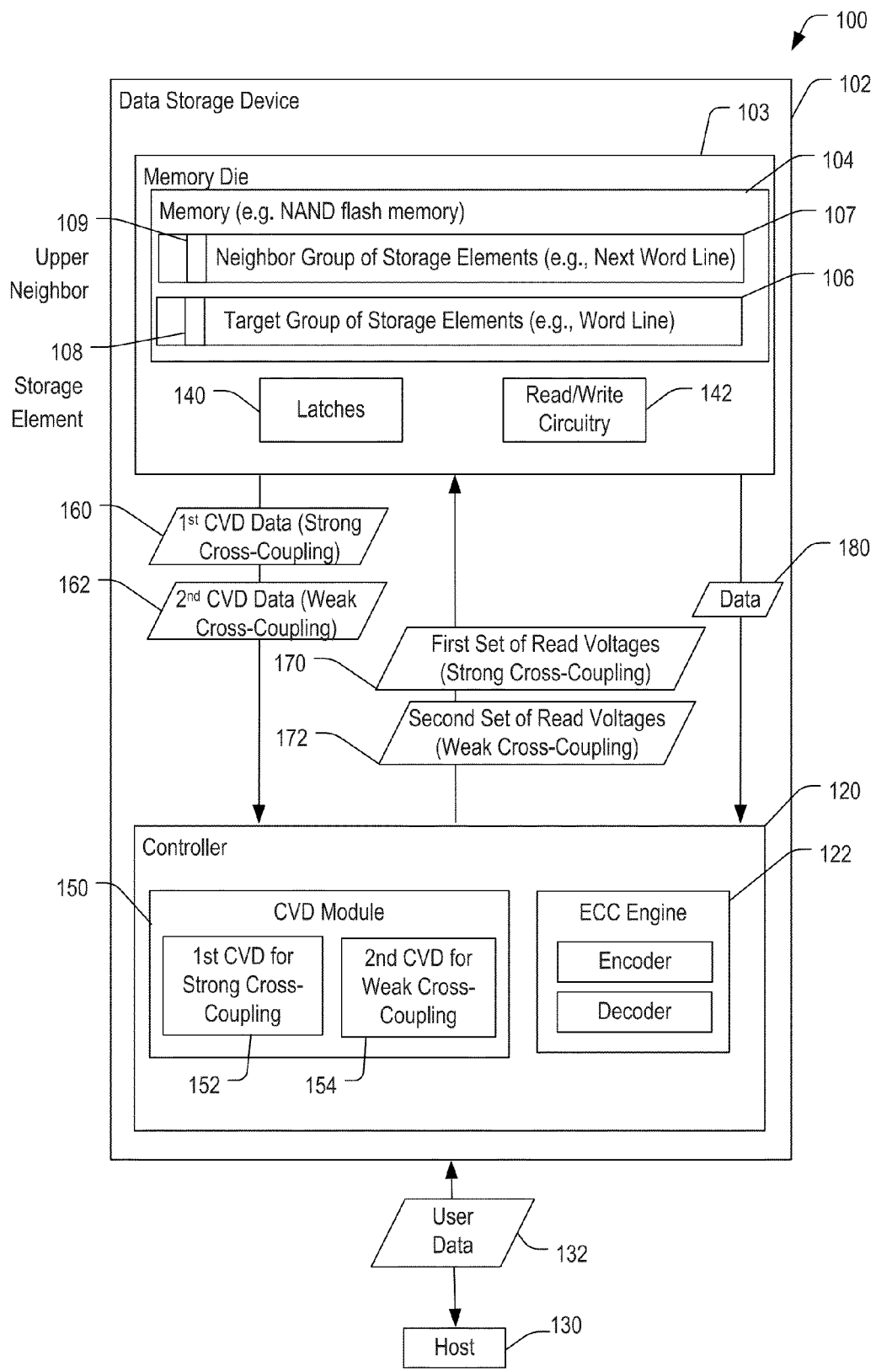
FIG. 1 is a block diagram of a particular illustrative embodiment of a system including a data storage device configured to determine multiple sets of read voltages based on cross coupling effects of individual storage elements of a memory.

Referring to FIG. 1, a particular embodiment of a system 100 includes a data storage device 102 coupled to a host device 130. The data storage device 102 is configured to perform multiple CVD operations to determine multiple sets of read voltages to be used to read data from a memory 104 based on an amount of cross-coupling experienced by storage elements of the memory 104.

The host device 130 may be configured to provide data, such as the user data 132, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer, a notebook computer, or a tablet, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The data storage device 102 includes the memory 104 coupled to a controller 120. The memory 104 may be a non-volatile memory, such as a NAND flash memory. The memory 104 includes a target group 106 of storage elements, such as a word line of a multi-level cell (MLC) flash memory. The target group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a Compact-Flash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 also includes a neighbor group 107 of storage elements, such as a word line of a multi-level cell (MLC) flash memory that is adjacent to the target group 106. The neighbor group 107 includes a representative "upper neighbor" storage element 109, such as a flash MLC cell on a same bit line as the storage element 108 that may disturb a state of the storage element 108 when programmed, due to cross-coupling effects.

A memory die 103 includes the memory 104, latches 140, and read/write circuitry 142. The latches 140 may include multiple latches, and each latch may be sized to store data read from the target group 106 (e.g., a word line of data). The latches 140 may include circuitry that is configurable to perform bit-wise logical operations, such as to perform an AND, OR, or exclusive-OR operation (as illustrative examples) of each bit in one latch with a corresponding bit in another latch. The latches 140 may be configured to receive data to be stored into the memory 104 and may also be configured to receive data that is read from the memory 104.

The read/write circuitry 142 may include circuitry configured to apply one or more voltages to designated portions of the memory 104 to read data from or write data to the memory 104. For example, the read/write circuitry 142 may be configured to apply one or more read voltages to a word line of multiple flash memory cells to generate sense data indicating whether a threshold voltage of each of the flash memory cells in the word line is greater than or less than the read voltage.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104.

The controller 120 includes an ECC engine 122 that is configured to receive data to be stored to the memory 104 and to generate a codeword. For example, the ECC engine 122 may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder configured to decode data read from the memory 104 to detect and correct, up to an error correction capability of the ECC scheme, any bit errors that may be present in the data.

The controller 120 includes a CVD module 150 that is configured to perform a first CVD operation 152 for storage elements of the target group 106 that are subject to strong cross-coupling effects. The CVD module 150 is also configured to perform a second CVD operation 154 for storage elements of the target group 106 that are subject to weak cross-coupling effects. The CVD module 150 may be configured to generate a first set of read voltages 170 resulting from the first CVD operation 152 and to generate a second set of read voltages 172 resulting from the second CVD operation 154.

During operation, the controller 120 may determine that the CVD module 150 is to be used, and data is read from the target group of storage elements 106. For example, the host device 130 may request data that is stored in the target group of storage elements 106. However, upon decoding the data read from the target group of storage elements 106, the decoder of the ECC engine 122 may determine that the data has a number of errors that exceeds an error correction capability of the decoder. In response, the controller 120 may initiate CVD operations at the CVD module 150.

For example, the controller 120 may send a command to instruct the read/write circuitry 142 to read data values from the neighbor group of storage elements 109 into the latches 140. As described in further detail with respect to FIG. 2, one or more logical operations may be performed to the data in the latches 140 to generate one or more cross-coupling flag bits for each storage element of the target group of storage elements 106. The cross-coupling flag bits may also be stored in the latches 140.

The controller 120 may send a command to instruct the read/write circuitry 142 to read data from the target group of storage elements 106, such as according to a dynamic read method. Data read from the target group of storage elements 106 may be masked or otherwise modified based on the cross-coupling flag bits to generate first CVD data 160 that corresponds to values read from storage elements that experience strong cross-coupling and to generate second CVD data 162 that corresponds to values read from storage elements that experience weak cross-coupling.

The controller 120 may provide the first CVD data 160 to the CVD module 150 and perform the first CVD operation 152 on the first CVD data 160 to determine the first set of read voltages 170. The controller 120 may provide the second CVD data 162 to the CVD module 150 and perform the second CVD operation 154 on the second CVD data 162 to determine the second set of read voltages 172. The controller 120 may send the first set of read voltages 170 and the second set of read voltages 172 to the memory die 103 to be used by the read/write circuitry 142.

Figure 3:
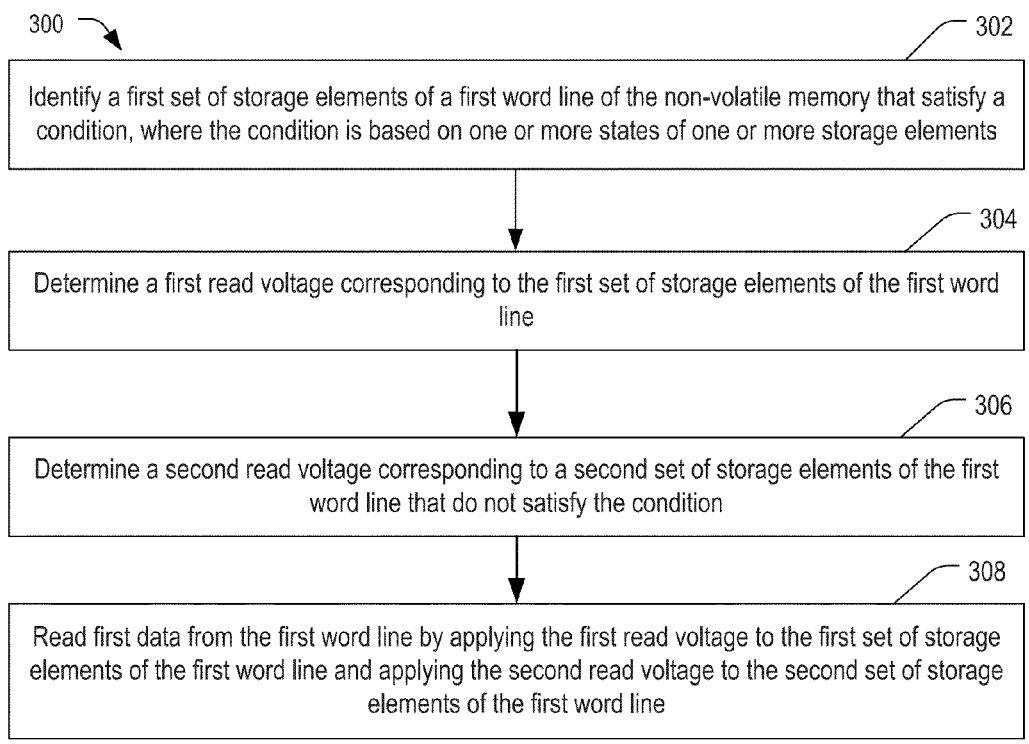
FIG. 3 is a flow chart that illustrates a particular embodiment of a method of determine multiple sets of read voltages based on cross coupling effects of individual storage elements of a memory.

The read/write circuitry 142 may read the target group of storage elements 106 by using the first set of read voltages 170 to read storage elements having a first value of a cross-coupling flag and by using the second set of read voltages 172 to read storage elements having a second value of the cross-coupling flag, such as described in further detail with respect to FIG. 3. The resulting data 180 may be sent to the controller 120 and is likely to have fewer errors than the data read from the target group of storage elements 106 prior to initiating the CVD operations 152-154. As a result, the data 180 may be decodable by the ECC engine 122.

Although FIG. 1 describes operation in terms of "strong" cross-coupling and "weak" cross-coupling, such terms are relative and provided for ease of description. As described in further detail with respect to FIG. 2, a determination whether a storage element is subject to "strong" or "weak" cross-coupling may be based on a state of, or data stored in, one or more neighboring cells, and may be further based on a programming process applied by the read/write circuitry 142. In addition, although FIG. 1 describes some operations being performed at the controller 120 and other operations being performed in the latches 140, in other implementations the controller 120 may perform operations such as determining values of cross-coupling flags and/or generating the data 180 from multiple sets of data read from the target group of storage elements 106 by application of the cross-coupling flags.

Figure 2:
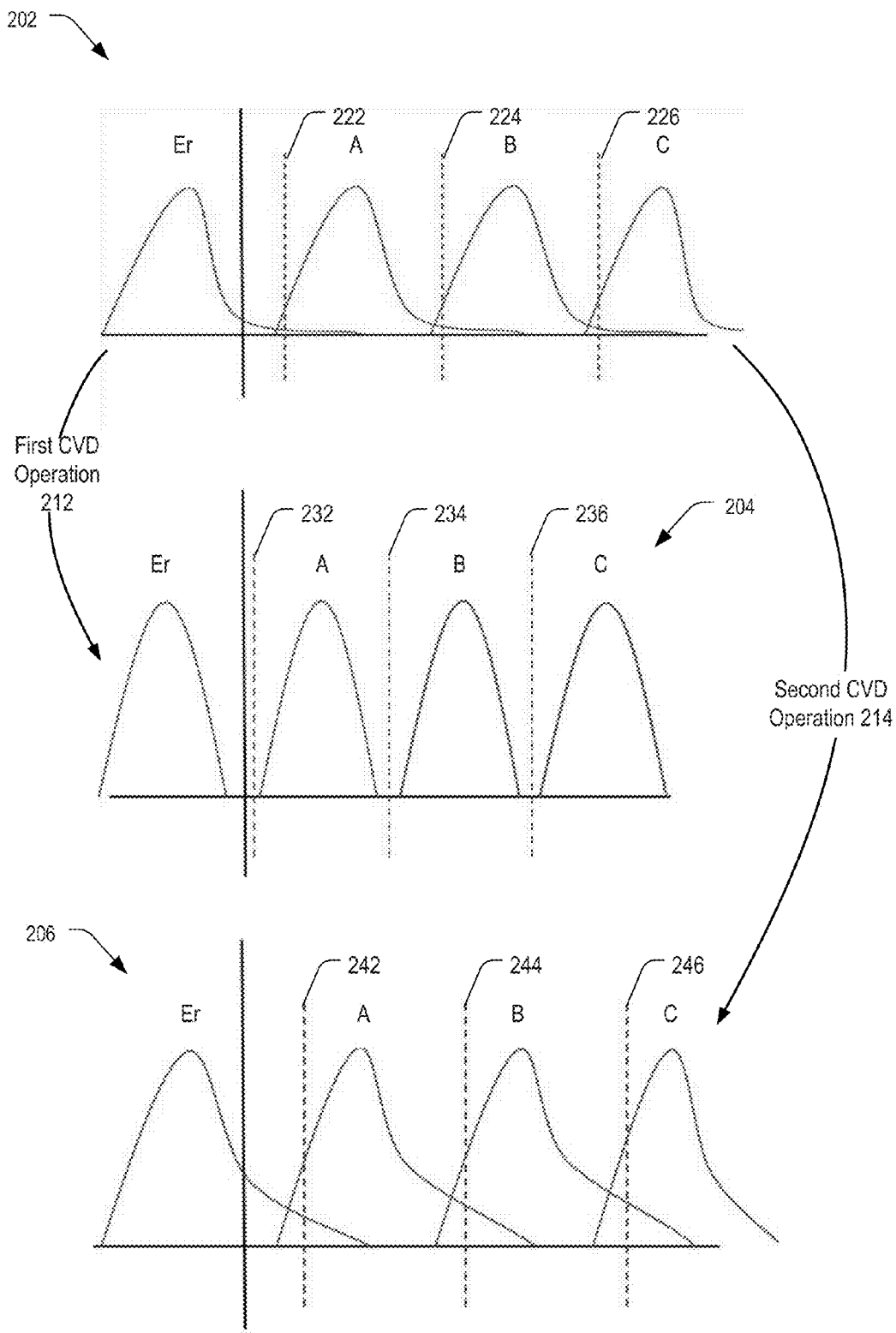
FIG. 2 is a diagram illustrating operations that may be performed in the data storage device of FIG. 1.

By generating the data 180 using different sets of read voltages 170 or 172 depending on an amount of cross-coupling experienced by individual storage elements, an amount of errors occurring in the data 180 may be reduced, as explained further with respect to FIG. 2. As a result, a reliability of stored data may be improved due to fewer bit errors occurring during storage in the memory 104. Improved reliability may enable operation using a less-powerful ECC engine, resulting in reduced power consumption, reduced device size, reduced manufacturing cost, or a combination thereof. Alternatively, or in addition, improved reliability may enable longer operational life of the memory 104.

Referring to FIG. 2, a graph 202 illustrates an example CVD for a population of all storage elements in a target word line, a graph 204 illustrates an example CVD for only the storage elements in the target word line that are not subject to a strong cross-coupling effect, and a graph 206 illustrates an example CVD for only the storage elements in the target word line that are subject to a strong cross-coupling effect. The graph 202 illustrates locations of reading points that may be selected by a conventional CVD tracking algorithm as dashed lines. A first read voltage 222 corresponds to an Er-A reading point (i.e., a boundary between the erase state (Er) and state A). A second read voltage 224 corresponds to an A-B reading point (i.e., a boundary between state A and state B). A third read voltage 226 corresponds to a B-C reading point (i.e., a boundary between state B and state C).

Graph 204 shows the CVD for the population of storage elements in the target word line that are not subject to a strong cross-coupling effect. For example, graph 204 may represent the population of storage elements that have an upper neighbor that is kept at the erase state or that is shifted only a small amount after the target storage elements is programmed The CVD in graph 204 has no overlap between states. A set of reading points that differentiates between the states without generating bit errors are shown as read voltages 232, 234, and 236. Note that the number of storage elements represented in graph 204 is less than the number of storage elements represented by graph 202 and therefore the vertical scale of graph 204 is different than graph 202.

Graph 206 shows the CVD for the population of all storage elements in the same target word line that are subject to a strong cross-coupling effect. For example, graph 206 may represent the population of storage elements that have an upper neighbor that is programmed in a way that generates a large voltage shift after the target storage element is programmed It can be seen that a significant overlap exists between the states of the CVD in graph 206. A conventional CVD tracking algorithm may set the reading points as shown by the dashed lines to minimize the number of bit errors when reading. The reading points in graph 206 are significantly shifted to the right compared to the reading points of the entire population of storage elements shown in graph 202. Note that the number of storage elements represented in graph 206 is less than the number of storage elements represented by graph 202 and therefore the vertical scale of graph 204 is different than graph 202.

Because graph 202 shows an average between a first population of storage elements that are not subject to strong cross-coupling effects (graph 204) and a second population of storage elements that are subject to strong cross-coupling effects (graph 206), graph 202 shows an overlap between the states but the overlap is smaller than the overlap in graph 206. Therefore, the locations of the reading points that would be selected by a conventional CVD tracking algorithm for the CVD of graph 202 are between those of graph 204 and graph 206 and are significantly different than the reading points of graph 206.

Applying a CVD tracking algorithm to a target word line that includes some storage elements that experience cross-coupling effects and that includes other storage elements that do not experience cross-coupling effects results in selecting a set of reading points that, even though appropriate for the entire population of storage elements taken as a whole, differs from reading points determined for the graph 206. To illustrate, reading all storage elements of the target word line using the read voltages 222-226 of graph 202 results in errors arising from reading storage elements with strong cross-coupling because the read voltages 222-226 do not accurately compensate for shifting and widening between the states (Er, A, B, and C).

By identifying which storage elements are subject to cross-coupling effects, the controller 120 of FIG. 1 enables partitioning of the population of storage elements of graph 202 so that a first CVD operation 212 may be applied to storage elements that do not experience strong cross-coupling effects to generate a first set of the read voltages 232-236 and a second CVD operation 214 may be applied to storage elements that experience cross-coupling effects to generate a second set of the read voltage 242-246. For example, the controller 130 may perform the first CVD operation 152 of FIG. 1 to generate a first read voltage and the second CVD operation 154 to generate a second read voltage that correspond to a first state boundary (e.g., read voltages 242 and 232, respectively). The first CVD operation 152 may also determine a third read voltage and the second CVD operation 154 may also determine a fourth read voltage corresponding to a second state boundary (e.g., read voltages 244 and 234, respectively). The first read voltage and the third read voltage (e.g., read voltages 242 and 244) correspond to the set of storage elements that experience strong cross-coupling effects (e.g., graph 206) and the second read voltage and the fourth read voltage (e.g., read voltages 232 and 234) correspond to the set of storage elements that may not experience strong cross-coupling effects (e.g., graph 204).

By reading data from storage elements of the target word line using the first set of read voltages 232-236 and using the second set of read voltages 242-246, a number of bit errors in the data may be reduced as compared to reading all storage elements of the target word line using the read voltages 222-226. To illustrate, sensing the second set of storage elements that experience cross-coupling effects using the read voltages 242-246 results in fewer bit errors than reading the second set of storage elements using the read voltages 222-226, and sensing the first set of storage elements using the read voltages 232-236 may also result in fewer bit errors than reading the first set of storage elements using the voltages 222-226. As a result, an overall number of errors may be reduced.

Storage elements that experience strong cross-coupling effects may be determined and indicated by using a cross-coupling flag. For example, for each target storage element in the target word line, a cross-coupling flag (CCF) may be defined to indicate whether the storage element is in the population of strong coupling (e.g., graph 206) or the population of weak coupling (e.g., graph 204). The determination of the flag value can be based on the data of the interfering neighbor storage element. For example, if the interfering neighbor storage element has a large voltage shift after the target storage element is brought to its final threshold voltage, then the CCF may be set to an "ON" value for the target storage element. Otherwise, the CCF for the target storage element may be set to an "OFF" value. The determination may be based on the data of the target storage element. For example, if the target storage element is in the erase state then CCF=ON, otherwise CCF=OFF. The determination may be based on a combination of the data in the interfering storage element and the data in the target storage element.

Determining the value of CCF for the target storage elements may be based on the specific programming plan employed when programming the flash memory. One example is to set CCF=ON for any target storage element whose upper neighbor is in a state in the higher half of the set of states (e.g., states B and C of FIG. 2), and set CCF=OFF otherwise. This example may be particularly applicable to a case when no programming plan is applied for reducing cross-coupling effects. Another example is to set CCF=ON for any target storage element that is in an erased state, and to set CCF=OFF otherwise. This example may be particularly applicable to a case where a Foggy-Fine-type programming plan is applied where alternate word lines are programmed using multiple alternating stages of increasing resolution. Another example is to set CCF=ON for any target storage element whose upper neighbor is either in state A or in state C, and to set CCF=OFF otherwise. This example may be particularly applicable to a case when an LM-type programming plan is applied in a two-bits-per-cell memory where a low-order bit is programmed first, followed by a higher-order bit.

Although cross-coupling classification may be represented by a single flag (dividing the population of target storage elements to two separate populations), other implementations may use multiple flags per target storage element (dividing the population of target storage elements into more than two separate populations). Working with multiple bit flags may reduce errors as compared to using a single bit flag per target storage element.

CCF flags can be generated within the memory die 103 (for example, by reading a next word line and setting CCF values for each storage element to be equal to the lower bit read from the storage element of the next word line). Alternatively, CCF flags can be computed by the controller 120 and submitted from the controller 120 to the memory die 103. For example, the controller 120 may read in the target word line and the next word line and compute the CCF according to a combination of values of the target word line and the neighboring word line. The controller 120 may take into account interference from multiple neighboring storage elements and may determine the CCF values according to one or more combinations of neighboring storage element values.

A CCF bit may be determined for each target storage element and loaded into one of the latches 140 in the memory die 103. Alternatively, it can be computed by the controller 120 and transferred from the controller to the latches 140 in the memory die 103. Alternatively, the CCF values may be computed by the controller 120 but not transferred from the controller 120 to the memory die 103. Multiple transfers of data from the memory die 103 to the controller 120 may be avoided and only one transfer may be performed for each CVD tracking sensing step. It should be noted that the data used in determining the CCF values need not be 100% accurate. Data read from the memory (either target word line or next word line) that contains errors may be used for determining the CCF without first applying error correction to the data. Although not applying error correction may result in some cells having an incorrect CCF value, the majority of the cells are likely to produce correct data to generate correct CCF values without error correction, improving an overall accuracy of reading data while avoiding latency associated with decoding.

The first CVD operation 212 may be performed by the controller 120 to perform CVD tracking only for the population of storage elements with weak coupling effects (e.g., graph 204). For example, in conventional CVD tracking, the target word line may be read using an increasing sequence of voltage points. A one value may be returned in response to the threshold voltage of the storage element being lower than the reading voltage, and a zero value may be returned in response to the threshold voltage of the storage element being higher than the reading voltage. Results are transferred out of a memory die, and the number of ones is counted. As the reading points increase in voltage, the number of ones increases. "Differentiating" the graph of a number of one values as a function of reading voltage results in histogram data that may be used for determining reading points.

In contrast, the first CVD operation 212 takes into account only storage elements that are weakly-coupled (that is, having CCF=OFF). For each reading point of the CVD sequence, a logical OR operation may be performed between the result of sensing the word line (e.g., in one data latch) and the CCF flags (e.g., in another data latch) and the result may be sent to the controller 120. As a result of the logical OR operations, each storage element whose CCF=ON has a constant value of one in all results that are transferred out to the controller 120. As a result, when "differentiating" the graph by subtracting counts of activated storage elements at successive reading points, the storage elements with CCF=ON cancel out and have no effect on the resulting histogram. Only the storage elements with CCF=OFF affect the histogram and its minimum points. Thus, applying a CVD tracking algorithm to the modified data generates a set of reading points for the population of storage elements having weak coupling, ignoring the storage elements having strong coupling.

As another example, a logical AND operation may be performed between the result of the sensing of the target word line and the logical inverse (NOT) of the CCF flags (NOT (CCF)). As a result, each storage element whose CCF=ON has a constant value of zero in all results that are transferred out to the controller 120 so that the counts of the storage elements with strong coupling effects cancel out and have no effect on the resulting histogram and on the reading points.

The second CVD operation 214 may perform CVD tracking only for the population of storage elements with strong coupling effects (e.g., graph 206). Modification of the results of sensing the word line using a logical OR or AND operation, as described above, may be performed replacing CCF with NOT (CCF). The second CVD operation 214 generates a second set of reading points for the population of storage elements having strong coupling effects.

Although the first CVD operation 212 and the second CVD operation 214 may be performed sequentially, in other implementations the first CVD operation 212 and the second CVD operation 214 may be interleaved so that no reading point of the CVD tracking sequence is sensed twice. Instead, in an example implementation, each reading point is sensed once into a first latch, a copy is kept in a second latch, a logical OR of the first latch with a latch storing CCF values is performed, and a result is transferred out to the controller. The copy of the sensing result may be restored to the first latch, the ORing with NOT(CCF) is performed, and the result is transferred out to the controller. The controller receives both results and directs each result to a corresponding process (e.g., the first CVD 152 or the second CVD 154 of FIG. 1). This interleaving scheme avoids duplication of sensing time between the two CVD operations 212, 214.

Each target storage element may be read with its associated set of reading points depending on which of the two populations the target storage element belongs to.

In some implementations, simultaneous sensing of each storage element with its specific reading voltage may be performed. For example, when sensing the border between states A and B, some storage elements (those that are weakly coupled) are compared to the reading voltage 234 for the weakly-coupled population, while other storage elements (those that are strongly coupled) are compared to the reading voltage 244 for the strongly-coupled population. Simultaneous sensing at different voltage points may be implemented using read circuitry at the memory die 103 that is configured to control a switch using a latched value (e.g., a CCR flag) to select between a first voltage (e.g., voltage 234) and a second voltage (e.g., voltage 244) to apply to a gate of a flash memory cell. A single sensing may be performed for the target word line (per each state boundary) even though two different reference values are being compared. Note that if the differences between corresponding reference voltages are not the same for all state boundaries then there may be overhead in setting the reference voltages when moving from one reading point to the next reading point. In such cases latency may be reduced by approximating the reading points for one or more of the populations in order to keep the differences fixed, rather than variable, across all the reading points.

In other implementations, if the memory die 103 does not support simultaneous sensing of multiple references, reading may be performed under instruction from the controller 120. The target word line may be sensed twice, once per each set of reading points, and the results may be kept in two of the latches 140 in the memory die 103. Assume that a latch "L1" keeps results for the weakly-coupled population and a latch "L2" keeps a result for the strongly-coupled population. Values in a latch "L3" may be computed as L3=(CCF AND L2) OR (NOT(CCF) AND L1). This result provides the value for each target storage element according to the population the target storage element belongs to. The logical operations can be implemented in the memory die 103, the controller 120 or in dedicated hardware.

In other implementations, another form of multi-sensing in which some parts of the sensing process are shared between the two reference values (for example the pre-charge stage) using two sequential steps for sensing the two different references (for example by employing both fast and slow discharging detection circuits) may be used.

It should be noted that the sensing of the target word line may be separately performed for each logical page of the word line. For example, in an embodiment where a word line stores an upper page and a lower page of data, the target word line may be sensed to read the lower page (e.g., if the user requested only the lower page) or to sense the upper page (e.g., if the user requested only the upper page) or to separately sense lower and upper pages (e.g., if the user requested both pages).

The disclosed embodiments enable performing a selective CVD tracking procedure that is independently determined for storage elements that experience strong cross coupling effects and for storage elements that do not experience such effects. Independently determining read voltages for multiple populations of storage elements based on exposure to cross-coupling effects reduces the number of bit errors of the memory storage elements.

The present disclosure may be applicable to all types of NAND flash memory regardless of the number of bits per storage element. Although the above examples describe using a single bit flag per storage element, multiple flag bits per cell may be used.

In some implementations, the disclosed selective CVD tracking can be used on every reading request. In other implementations, the disclosed selective CVD tracking may be used when another read operation has failed to correctly read the data.

Even though some embodiments are described with respect to cross coupling effects generated by an upper neighbor storage element, the present disclosure is equally applicable to compensating for coupling from other neighboring storage elements and from combinations of neighboring storage elements. For example, some additional logical operations (e.g., shifting operations) between values of neighboring storage elements may be performed in order to generate a CCF value that is a function of multiple neighbors.

Although CVD tracking is an effective and robust dynamic reading method, the present disclosure is equally applicable to other forms of dynamic reading, such as the use of precompiled tables of voltage offsets that are applied to the set of reading points.

FIG. 3 illustrates a method 300 of method of reading data. The method 300 may be performed at a data storage device that includes a non-volatile memory, such as the data storage device 102 of FIG. 1.

The method 300 includes identifying a first set of storage elements of a first word line of the non-volatile memory that satisfy a condition, at 302. The condition is based on one or more states of one or more storage elements. The condition may correspond to a disturbance of a state of a storage element of the first word line due to cross-coupling with at least one of the one or more storage elements. For example, the condition may be based on one or more states of one or more storage elements of a second word line (e.g., the neighbor group of storage elements 107) that is different from the first word line (e.g., the target group of storage elements 106). As another example, the condition may be based on one or more states of one or more storage elements of the first word line (e.g., the target group of storage elements 106). As another example, the condition may be based on one or more states of one or more storage elements of a second word line (e.g., the neighbor group of storage elements 107) that is different from the first word line (e.g., the target group of storage elements 106) and on one or more states of one or more storage elements of the first word line.

A first read voltage corresponding to the first set of storage elements of the first word line is determined, at 304. For example, the CVD module 150 may perform the first CVD operation 152 to generate the first set of read voltages 170.

A second read voltage corresponding to a second set of storage elements of the first word line that do not satisfy the condition is determined, at 306. For example, the CVD module 150 may perform the second CVD operation 154 to generate the second set of read voltages 172.

First data is read from the first word line by applying the first read voltage to the first set of storage elements of the first word line and applying the second read voltage to the second set of storage elements of the first word line, at 308. For example, the data 180 is generated by applying the first set of read voltages 170 and the second set of read voltages 172 to the target group of storage elements 106.

The group of storage elements effecting the evaluation of the condition for a first storage element of the first word line may not be identical to the group of storage elements effecting the evaluation of the condition for a second storage element of the first word line. Additionally, the group of storage elements effecting the evaluation of the condition for the first storage element may include the first storage element. Additionally, one or more storage elements of the target group of storage elements 106 may effect the evaluation of the condition for the storage element 108.

In some implementations, identifying the first set of storage elements may include reading second data from the group of one or more storage elements effecting the condition to determine state information of the one or more storage elements and identifying, for each of the one or more storage elements, whether the storage element has a state included in a corresponding set of states. Storage elements of the first word line may be identified as being in the first set in response to each of the one or more storage elements being in a state included in its corresponding set of states. For example, the storage element 108 may be identified as being in the first set based on the upper neighbor 109 being in states Er or A as opposed to being in states B or C of FIG. 2. For at least one of the one or more storage elements, the corresponding set of states may include a highest-voltage state or a lowest-voltage state.

In some implementations, identifying the first set of storage elements may include reading data from one or more word lines into one or more latches in the data storage device and performing one or more bitwise logical operations to the data in the one or more registers to generate flag data that includes a bit corresponding to each of the storage elements of the first word line. A first bit value may indicate the first set of storage elements and a second bit value may indicate the second set of storage elements.

Determining the first read voltage may include applying a first sequence of read voltages to the first set of storage elements of the first word line to determine a first cell voltage distribution (CVD) that corresponds to the first set of storage elements and that excludes the second set of storage elements. The first read voltage may be selected based on the first CVD. Determining the second read voltage may include applying a second sequence of read voltages to the second set of storage elements of the first word line to determine a second cell voltage distribution (CVD) that corresponds to the second set of storage elements and that excludes the first set of storage elements. The second read voltage may be selected based on the second CVD.

The method 300 may include applying a sequence of read voltages to the first set of storage elements of the first word line and to the second set of storage elements of the first word line to generate sensing data. First values of the sensing data corresponding to storage elements in the second set of storage elements may be masked to determine a first cell voltage distribution (CVD) corresponding to the first set of storage elements and excluding the second set of storage elements. Second values of the sensing data corresponding to storage elements in the first set of storage elements may be masked to determine a second CVD corresponding to the second set of storage elements and excluding the first set of storage elements. Determining the first read voltage may include selecting the first read voltage based on the first CVD, and determining the second read voltage may include selecting the second read voltage based on the second CVD.

In some implementations, reading the data from the first word line may include using a parallel sensing operation to apply the first read voltage to the first set of storage elements of the first word line and to apply the second read voltage to the second set of storage elements of the first word line at the same time. In other implementations, reading the data from the first word line includes using a single sensing command to apply the first read voltage to the first set of storage elements of the first word line and to apply the second read voltage to the second set of storage elements of the first word line. In other implementations, reading the data from the first word line includes using sequential sensing operations to apply the first read voltage to the first set of storage elements of the first word line and to apply the second read voltage to the second set of storage elements of the first word line.

Although various components depicted herein are illustrated as block components and described in general terms, such components may include one or more microprocessors, state machines, or other circuits configured to enable the controller 120 of FIG. 1 to generate the multiple sets of read voltages 170-172. For example, the controller 120 may represent physical components, such as hardware controllers, state machines, logic circuits, or other structures, to enable the controller 120 of FIG. 1 to perform the multiple CVD operations 152-154 and to generate the multiple sets of read voltages 170-172.

The controller 120 may be implemented using a microprocessor or microcontroller programmed to receive the first CVD data 160 and to generate the first set of read voltages 170 based on the first CVD data 160 and to receive the second CVD data 162 and to generate the second set of read voltages 172 based on the second CVD data 162. In a particular embodiment, the controller 120 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of reading data, the method comprising:
at a data storage device that includes a non-volatile memory having a three-dimensional (3D) configuration and circuitry associated with operation of memory cells of the non-volatile memory, performing:
identifying a first set of storage elements of a first word line of the memory cells of the non-volatile memory that satisfy a condition, wherein the condition is based on one or more states of one or more storage elements, and
wherein identifying the first set of storage elements includes:
reading data from one or more word lines into one or more latches in the data storage device; and
performing one or more bitwise logical operations to the data in the one or more latches to generate flag data that includes one or more bits, each of the one or more bits corresponding to one of the storage elements of the first word line;
determining a first read voltage corresponding to the first set of storage elements of the first word line;
determining a second read voltage corresponding to a second set of storage elements of the first word line that do not satisfy the condition; and
reading first data from the first word line by applying the first read voltage to the first set of storage elements of the first word line and applying the second read voltage to the second set of storage elements of the first word line.

2. The method of claim 1, wherein the condition corresponds to a disturbance of a state of a storage element of the first word line due to cross-coupling with at least one of the one or more storage elements.

3. The method of claim 1, wherein the condition is based on one or more states of one or more storage elements of a second word line that is different from the first word line.

4. The method of claim 1, wherein the condition is based on one or more states of one or more storage elements of the first word line.

5. The method of claim 1, wherein the condition is based on one or more states of one or more storage elements of a second word line that is different from the first word line and based on one or more states of one or more storage elements of the first word line.

6. The method of claim 1, wherein a first group of storage elements affecting evaluation of the condition for a first storage element of the first word line differs from a second group of storage elements affecting evaluation of the condition for a second storage element of the first word line.

7. The method of claim 6, wherein the first group of storage elements affecting the evaluation of the condition for the first storage element includes the first storage element.

8. The method of claim 1, wherein identifying the first set of storage elements includes:
reading second data from a group of one or more storage elements affecting the condition to determine state information of the group of one or more storage elements; and
identifying, for each storage element of the group of one or more storage elements, whether the storage element has a state included in a corresponding set of states,
wherein storage elements of the first word line are identified as being in the first set in response to the state of each storage element of the group of one or more storage elements being included in the corresponding set of states.

9. The method of claim 8, wherein for at least one storage element of the group of one or more storage elements the corresponding set of states includes a highest-voltage state.

10. The method of claim 8, wherein for at least one storage element of the group of one or more storage elements the corresponding set of states includes a lowest-voltage state.

11. The method of claim 1, wherein a first bit value of a particular bit of the one or more bits indicates that a corresponding storage element is included in the first set of storage elements, and wherein a second bit value of the particular bit indicates that the corresponding storage element is included in the second set of storage elements.

12. The method of claim 1, wherein determining the first read voltage includes:
applying a first sequence of read voltages to the first set of storage elements of the first word line to determine a first cell voltage distribution (CVD) that corresponds to the first set of storage elements and that excludes the second set of storage elements; and selecting the first read voltage based on the first CVD.

13. The method of claim 12, wherein determining the second read voltage includes:

applying a second sequence of read voltages to the second set of storage elements of the first word line to determine a second cell voltage distribution (CVD) that corresponds to the second set of storage elements and that excludes the first set of storage elements; and selecting the second read voltage based on the second CVD.

14. The method of claim 1, further comprising:

applying a sequence of read voltages to the first set of storage elements of the first word line and to the second set of storage elements of the first word line to generate sensing data;

masking first values of the sensing data corresponding to storage elements in the second set of storage elements to determine a first cell voltage distribution (CVD) corresponding to the first set of storage elements and excluding the second set of storage elements; and masking second values of the sensing data corresponding to storage elements in the first set of storage elements to determine a second CVD corresponding to the second set of storage elements and excluding the first set of storage elements, wherein determining the first read voltage includes selecting the first read voltage based on the first CVD, and wherein determining the second read voltage includes selecting the second read voltage based on the second CVD.

15. The method of claim 1, wherein reading the data from the first word line includes using a parallel sensing operation to apply the first read voltage to the first set of storage elements of the first word line and to apply the second read voltage to the second set of storage elements of the first word line at the same time.

16. The method of claim 1, wherein reading the data from the first word line includes using a single sensing command to apply the first read voltage to the first set of storage elements of the first word line and to apply the second read voltage to the second set of storage elements of the first word line.

17. The method of claim 1, wherein reading the data from the first word line includes using sequential sensing operations to apply the first read voltage to the first set of storage elements of the first word line and to apply the second read voltage to the second set of storage elements of the first word line.

18. A data storage device comprising:

a non-volatile memory having a three-dimensional (3D) configuration and circuitry associated with operation of memory cells of the non-volatile memory; and a controller configured to identify a first set of storage elements of a first word line of the memory cells of the non-volatile memory that satisfy a condition, wherein the condition is based on one or more states of one or more storage elements, to determine a first read voltage corresponding to the first set of storage elements of the first word line and to determine a second read voltage corresponding to a second set of storage elements of the first word line that do not satisfy the condition, wherein the controller is configured to identify the first set of storage elements by reading data from one or more word lines into one or more latches in the data storage device and performing one or more bitwise logical operations to the data in the one or more latches to generate flag data that includes one or more bits, each of the one or more bits corresponding to one of the storage elements of the first word line, and wherein the controller is configured to read first data from the first word line by applying the first read voltage to the first set of storage elements of the first word line and applying the second read voltage to the second set of storage elements of the first word line.

19. The data storage device of claim 18, wherein the condition corresponds to a disturbance of a state of a storage element of the first word line due to cross-coupling with at least one of the one or more storage elements.

20. The data storage device of claim 18, wherein the condition is based on one or more states of one or more storage elements of a second word line that is different from the first word line.

21. The data storage device of claim 18, wherein the condition is based on one or more states of one or more storage elements of the first word line.

22. The data storage device of claim 18, wherein the condition is based on one or more states of one or more storage elements of a second word line that is different from the first word line and based on one or more states of one or more storage elements of the first word line.

23. The data storage device of claim 18, wherein the controller is configured to identify the first set of storage elements by reading second data from a group of one or more storage elements affecting the condition to determine state information of the group of one or more storage elements and identifying, for each storage element of the group of one or more storage elements, whether the storage element has a state included in a corresponding set of states, and wherein storage elements of the first word line are identified as being in the first set in response to the state of each storage element of the group of one or more storage elements being included in the corresponding set of states.

24. The data storage device of claim 18, wherein a first bit value of a particular bit of the one or more bits indicates that a corresponding storage element is included in the first set of storage elements, and wherein a second bit value of the particular bit indicates that the corresponding storage element is included in the second set of storage elements.

25. The data storage device of claim 18, wherein the controller is configured to determine the first read voltage by applying a first sequence of read voltages to the first set of storage elements of the first word line to determine a first cell voltage distribution (CVD) that corresponds to the first set of storage elements and that excludes the second set of storage elements and selecting the first read voltage based on the first CVD.

26. The data storage device of claim 18, wherein the controller is configured to:

apply a sequence of read voltages to the first set of storage elements of the first word line and to the second set of storage elements of the first word line to generate sensing data;

mask first values of the sensing data corresponding to storage elements in the second set of storage elements to determine a first cell voltage distribution (CVD) corresponding to the first set of storage elements and excluding the second set of storage elements; and mask second values of the sensing data corresponding to storage elements in the first set of storage elements to determine a second CVD corresponding to the second set of storage elements and excluding the first set of storage elements, wherein determining the first read voltage includes selecting the first read voltage based on the first CVD, and wherein determining the second read voltage includes selecting the second read voltage based on the second CVD.

27. The data storage device of claim 18, wherein the controller is configured to use a parallel sensing operation to apply the first read voltage to the first set of storage elements of the first word line and to apply the second read voltage to the second set of storage elements of the first word line at the same time to read the data from the first word line.

28. The data storage device of claim 18, wherein the controller is configured to use a single sensing command to apply the first read voltage to the first set of storage elements of the first word line and to apply the second read voltage to the second set of storage elements of the first word line to read the data from the first word line.

29. The data storage device of claim 18, wherein the first read voltage and the second read voltage correspond to a first state boundary and wherein the controller is configured to determine a third read voltage and a fourth read voltage corresponding to a second state boundary, wherein the third read voltage corresponds to the first set of storage elements and wherein the fourth read voltage corresponds to the second set of storage elements.

30. A data storage device comprising:

a non-volatile memory having a three-dimensional (3D) configuration and circuitry associated with operation of memory cells of the non-volatile memory; and a controller configured to identify a first set of storage elements of a first word line of the memory cells of the non-volatile memory that satisfy a condition, wherein the condition is based on one or more storage elements, to determine a first read voltage corresponding to the first set of storage elements of the first word line and to determine a second read voltage corresponding to a second set of storage elements of the first word line, wherein the controller is configured to identify the first set of storage elements by reading data from one or more word lines into one or more latches in the data storage device and performing one or more bitwise logical operations to the data in the one or more latches to generate flag data that includes one or more bits, each of the one or more bits corresponding to one of the storage elements of the first word line, and wherein the controller is configured to apply the first read voltage to the first set of storage elements of the first word line and to apply the second read voltage to the second set of storage elements of the first word line.

* * * * *